United States Patent
Seo et al.

(10) Patent No.: US 11,092,934 B2
(45) Date of Patent: Aug. 17, 2021

(54) METHOD AND APPARATUS FOR DETERMINING INFORMATION FOR BUILDING INFORMATION MODELING

(71) Applicant: Samsung Electronics Co., Ltd., Suwon-si (KR)

(72) Inventors: Sung-Mok Seo, Suwon-si (KR); Dong-Seop Lee, Suwon-si (KR); Hun-Jung Lim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 330 days.

(21) Appl. No.: 15/322,013

(22) PCT Filed: Jun. 25, 2015

(86) PCT No.: PCT/KR2015/006470
§ 371 (c)(1),
(2) Date: Dec. 23, 2016

(87) PCT Pub. No.: WO2015/199457
PCT Pub. Date: Dec. 30, 2015

(65) Prior Publication Data
US 2017/0123386 A1    May 4, 2017

(30) Foreign Application Priority Data
Jun. 26, 2014 (KR) .................. 10-2014-0078647

(51) Int. Cl.
*G05B 13/04* (2006.01)
*G06Q 50/06* (2012.01)
(Continued)

(52) U.S. Cl.
CPC ........... *G05B 13/041* (2013.01); *G06F 30/13* (2020.01); *G06Q 10/06* (2013.01); *G06Q 10/10* (2013.01); *G06Q 50/06* (2013.01); *G06Q 50/08* (2013.01)

(58) Field of Classification Search
CPC ...... G05B 13/041; G06Q 10/06; G06Q 50/08; G06Q 50/06; G06Q 10/10; G06F 17/5004; G06F 30/13; Y04S 10/54
See application file for complete search history.

(56) References Cited

U.S. PATENT DOCUMENTS 8,694,292 B2 * 4/2014 Peterman ................ G06F 30/13
703/6
8,914,256 B1 * 12/2014 Schneider ............... G06T 19/20
703/1
(Continued)

FOREIGN PATENT DOCUMENTS

CN        103530827 A    1/2014
JP        2012-068698 A  4/2012
(Continued)

OTHER PUBLICATIONS

"Predetermine" [online] Merriam-Webster [retrieved on Dec. 19, 2018], Retrieved from <https://www.merriam-webster.com/dictionary/predetermine> (Year: 2018).*

(Continued)

Primary Examiner — Rehana Perveen
Assistant Examiner — Alfred H B Wechselberger
(74) Attorney, Agent, or Firm — Jefferson IP Law, LLP

(57) ABSTRACT

The present disclosure relates to a sensor network, Machine Type Communication (MTC), Machine-to-Machine (M2M) communication, and technology for Internet of Things (IoT). The present disclosure may be applied to intelligent services based on the above technologies, such as smart home, smart building, smart city, smart car, connected car, health care, (Continued)

digital education, smart retail, security and safety services. The present disclosure provides a method of determining information for building information modeling (BIM) by a BIM device. The method comprises detecting BIM data corresponding to type information related to a use characteristic of a building among predeterminded BIM data, determining a plurality of ranges for each of a plurality of parameters in the BIM data by using values for each of the plurality of parameters, generating multiple parameter sets based on the plurality of ranges for each of the plurality of parameters, and determining at least one of the multiple parameter sets as at least one parameter set to be used for the BIM, based on power consumption calculated for each of the multiple parameter sets.

18 Claims, 10 Drawing Sheets

(51) Int. Cl.
    *G06Q 10/06*     (2012.01)
    *G06F 30/13*     (2020.01)
    *G06Q 10/10*     (2012.01)
    *G06Q 50/08*     (2012.01)

(56) References Cited

U.S. PATENT DOCUMENTS

| | | | | |
|---|---|---|---|---|
| 9,396,293 | B2 * | 7/2016 | Sons | G06F 17/5004 |
| 2008/0015823 | A1 | 1/2008 | Arnold et al. | |
| 2010/0106674 | A1 * | 4/2010 | McLean | F24F 11/30 706/52 |
| 2011/0093424 | A1 | 4/2011 | Zimmermann et al. | |
| 2011/0246155 | A1 * | 10/2011 | Fitch | G06F 17/5004 703/6 |
| 2011/0246381 | A1 * | 10/2011 | Fitch | G06Q 10/04 705/313 |
| 2012/0271576 | A1 | 10/2012 | Kamel et al. | |
| 2012/0323382 | A1 * | 12/2012 | Kamel | G01D 21/00 700/286 |
| 2013/0169681 | A1 | 7/2013 | Rasane et al. | |
| 2014/0156700 | A1 | 6/2014 | Scholz | |
| 2014/0222394 | A1 * | 8/2014 | Drees | G06F 17/5009 703/2 |
| 2014/0324404 | A1 * | 10/2014 | de la Torre-Bueno | G06N 3/086 703/6 |
| 2015/0006129 | A1 * | 1/2015 | An | G06F 17/5009 703/2 |

FOREIGN PATENT DOCUMENTS

| | | | | |
|---|---|---|---|---|
| KR | 10-2012-0069737 | A | | 6/2012 |
| KR | 10-2014-0070193 | A | | 6/2014 |
| KR | 10-2014-0070194 | A | | 6/2014 |
| KR | 10-2014-0075278 | A | | 6/2014 |
| KR | 2014-0075527 | | * 6/2014 | ............. G06F 17/40 |
| WO | 2013/004661 | A1 | | 1/2013 |

OTHER PUBLICATIONS

Seem et al. "Adaptive methods for real-time forecasting of building electrical demand" ASHRAE Trans, vol. 97, Pt. 1; NY-91-10-3 [retrieved on Dec. 20, 2018], Retrieved from <https://www.researchgate.net/publication/245199450_Adaptive_methods_for_real-time_forecasting_of_building_electrical_demand> (Year: 1991).*
Rabl et al. "Parameter Estimation in Buildings: Methods for Dynamic Analysis of . . . " Jour of Solar Energy Eng, vol. 110 [retrieved on Dec. 20, 2018], Retrieved from <https://www.researchgate.net/publication/255498535_Parameter_Estimation_in_Buildings_Methods_for_Dynamic_Analysis_of_Measured_Energy_Use> (Year: 1988).*
Coakley, D. "Calibration of detailed building energy simulation models to measured data using uncertainty analysis" [thesis] NUI Galway (May 30, 2014) [retrieved on Dec. 20, 2018], Retrieved from <https://aran.library.nuigalway.ie/bitstream/handle/10379/4421/2014coakleyphd.pdf> (Year: 2014).*
Langner, M. "An Investigation of Design Parameters that Affect Commercial High-Rise Office Building Energy Consumption and Demand" [thesis] University of Colorado, Boulder [retrieved on Dec. 19, 2018], Retrieved from <http://scholar.colorado.edu/cgi/viewcontent.cgi?article=1046&context=cven_gradetds> (Year: 2010).*
Reddy et al. "Calibrating Detailed Building Energy Simulation Programs with Measured Data— Part I: General Methodology (RP-1051)" HVAC&R Research,vol. 13, No. 2 [retrieved on Dec. 19, 2018], Retrieved from <http://auroenergy.com/wp-content/uploads/2016/05/2007_Reddy_HVACR_Calibrating-Detailed-Pt1.pdf> (Year: 2007).*
Raftery (2009) et al. "Calibration of a Detailed Simulation Model to Energy Monitoring System Data: A Methodology and Case Study "IBPSA Conf, Glasgow, Scotland, pp. 1199-1206 [retrieved on Dec. 19, 2018], Retrieved from <https://pdfs.semanticscholar.org/1264/ae7cc3a2606886a446ac40885440aeef491a.pdf> (Year: 2009).*
Ramakrishna et al. "Online system for energy assessment in large facilities—Methodology & A real-world case study" 2013 Int. Green Computing Conf. Proc.; doi:10.1109/IGCC.2013.6604481 [retrieved on Jan. 27, 2020]. Retrieved from <https://ieeexplore.IEEE.org/abstract/document/6604481> (Year: 2013).*
Tarlow et al. "Automatically Calibrating a Probabilistic Graphical Model of Building Energy Consumption" 11th International IBPSA Conference, Glasgow, pp. 904-911 [retrieved on Jan. 27, 2020]. Retrieved from <http://citeseerx.ist.psu.edu/viewdoc/summary?doi=10.1.1.159.1758> (Year: 2009).*
Booth et al. "Calibrating Micro-level Models with Macro-level Data Using Bayesian Regression Analysis" 12th Conf. of Int. Building Performance Simulation Association, Sydney, pp. 641-648 [retrieved on Jan. 27, 2020]. Retrieved from <http://www.ibpsa.org/proceedings/BS2011/P_1296.pdf> (Year: 2011).*
Provan et al. "Using Building Information Model Data for Generating and Updating Diagnostic Models" Paper 94. Proceedings of the 12th Int Conf on Civil, Structural and Environmental Eng Computing [retrieved on Jul. 29, 2020]. Retrieved from <http://www.cs.ucc.ie/ccsl/GP-papers/2009/Provan_CEC_2009.pdf> (Year: 2009).*
Miller et al. "Hybrid Calibration Methodology for Building Energy Models Coupling Sensor Data and Stochastic Modeling" 2013 1st IEEE Conference on Technologies for Sustainability (SusTech) [retrieved on Dec. 19, 2018]. Retrieved from <https://ieeexplore.ieee.org/abstract/document/6617295/> (Year: 2013).*
Coakley et al. "A review of methods to match building energy simulation models to measured data" Renewable and Sustainable Energy Reviews, vol. 37, pp. 123-141 (May 2014) [retrieved on Dec. 19, 2018] (Year: 2014).*
Smith et al. "Automated Energy Model Creation for Conceptual Design" Proceedings of the 2011 Symposium on Simulation for Architecture and Urban Design, pp. 13-20 [retrieved on May 29, 2019] (Year: 2011).*
Subbiah et al. "A High Resolution Energy Demand Model for Commercial Buildings" International ETG-Congress, Berlin [retrieved on Dec. 16, 2020]. (Year: 2013).*
Zeng Tonghua; "Building Energy Saving Design Software Development and Application Based on BIM Technology"; Jul. 15, 2013; pp. 56-79; China Master's Theses Full-text Database; Engineering Science and Technology II; No. 7; China.
Chinese Office Action dated Aug. 29, 2018, issued in connection with a counterpart Chinese application No. 201580044554.4.
Korean Office Action with English translation dated Jun. 23, 2021; Korean Appln. No. 10-2014-0078647.

* cited by examiner

METHOD AND APPARATUS FOR DETERMINING INFORMATION FOR BUILDING INFORMATION MODELING

CROSS-REFERENCE TO RELATED APPLICATION(S)

This application is a U.S. National Stage application under 35 U.S.C. § 371 of an International application filed on Jun. 25, 2015 and assigned application number PCT/KR2015/006470, which claimed the benefit of a Korean patent application filed on Jun. 26, 2014 in the Korean Intellectual Property Office and assigned Serial number 10-2014-0078647, the entire disclosure of which is hereby incorporated by reference.

TECHNICAL FIELD

The present disclosure relates to a method and apparatus of determining information for building information modeling (BIM).

BACKGROUND

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched.

Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

A Building Energy Management System (BEMS) relates to a system which collects and analyzes various information of building energy management installations in real time to efficiently manage energy. There is a Building Information Modeling (BIM) technology as a building modeling technology which models building energy consumption and interworks with the climate to enable prediction and abnormal state monitoring in the BEMS. The BIM technology may largely be classified as a white-box modeling technology, a reference information based modeling technology, or a rate based modeling technology.

The white-box modeling technology corresponds to a technology of performing building modeling based on information measured by a plurality of sensors or measurement information such as drawing information. When the white-box modeling technology is used, a tool (e.g., EnergyPlus) which is largely applied to energy simulation may be used, and in this event, the measurement information may be used as an input value of the tool.

However, in order to use the white-box modeling technology, a sensor device should be mounted for acquiring measurement information and there is a problem in that a cost is generated due to this. Further, there is a problem in that several limitation conditions exist such as a time required to measuring all information required to use the white-box modeling technology and manpower required for the time. Therefore, the white-box modeling technology has high accuracy, but is not largely used due to a problem of a high cost and time consumption and a problem in which an identical operation is repeated.

The reference information based modeling technology corresponds to a technology of performing building modeling of reference information on building information using an input value of an energy simulator. The reference information may be predetermined energy standard information (e.g., information of ASHRAE 90.1 (energy standard for buildings except low-rise residential buildings)). The reference information based modeling technology corresponds to a building modeling technology which can most easily be used. However, the reference information based modeling technology has a limitation in being used for power consumption prediction and monitoring application such as anomaly detection due to a problem in which a large error between actual information and reference information is generated (when information of ASHRAE 90.1 is used, an error of 10~25% can be generated).

The rate based modeling technology corresponds to a building modeling technology based on a probabilistic method (e.g., a Bayesian Calibration method). The rate based modeling technology has a highly complex process, increases time consumption and human error due to a manual process for each step, and reduces accuracy as an absolute factor range (boundary) is configured.

The conventional BIM technologies have a time and financial cost problem, a complexity problem, and an accuracy problem. Therefore, these problems are considered to bring about a need for a BIM technology which is more efficient and has high accuracy.

Therefore, a need exists for a method and an apparatus in which a mobile terminal transmits a signal by controlling an uplink transmission power based on neighboring reception beam allocation information in a wireless communication system using beamforming.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of present disclosure is to provide a method and apparatus of determining information for building information modeling (BIM).

Another aspect of the present disclosure proposes a method and apparatus for accurately determining information for building information modeling to use the information.

Moreover, another aspect of present disclosure proposes a method and apparatus for accurately and simply performing building information modeling for efficient building energy management.

In accordance with an aspect of the present disclosure, there is provided a method of determining information for building information modeling (BIM) by a BIM device. The method comprises detecting BIM data corresponding to type information related to a use characteristic of a building among predeterminded BIM data; determining a plurality of ranges for each of a plurality of parameters in the BIM data by using values for each of the plurality of parameters; generating multiple parameter sets based on the plurality of ranges for each of the plurality of parameters; and determining at least one of the multiple parameter sets as at least one parameter set to be used for the BIM, based on power consumption calculated for each of the multiple parameter sets.

In accordance with another aspect of the present disclosure, there is provided a building information modeling (BIM) device. The BIM device comprises a controller configured to detect BIM data corresponding to type information related to a use characteristic of a building among predeterminded BIM data, determine a plurality of ranges for each of a plurality of parameters in the BIM data by using values for each of the plurality of parameters, generate multiple parameter sets based on the plurality of ranges for each of the plurality of parameters, and determine at least one of the multiple parameter sets as at least one parameter set to be used for the BIM, based on power consumption calculated for each of the multiple parameter sets.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Hereinafter, the operational principle of the present disclosure will be described in detail with reference to the accompanying drawings. In describing the present disclosure below, a detailed description of related known configurations or functions incorporated herein will be omitted when it is determined that the detailed description thereof may unnecessarily obscure the subject matter of the present disclosure. The terms which will be described below are terms defined in consideration of the functions in the present disclosure, and may be different according to users, intentions of the users, or customs. Therefore, the definitions of the terms should be made based on the contents throughout the specification.

Figure 1:
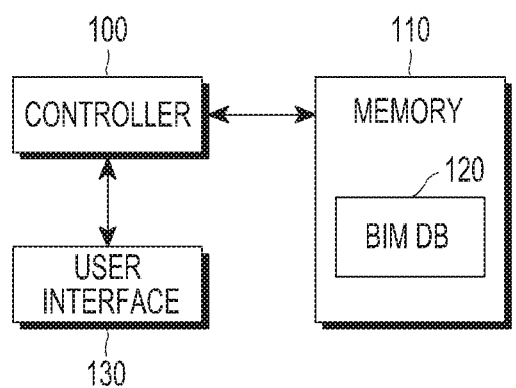
FIG. 1 is a block diagram illustrating an internal configuration of a Building Information Modeling (BIM) device according to an embodiment of the present disclosure.

FIG. 1 is a block diagram illustrating an internal configuration of a Building Information Modeling (BIM) device according to an embodiment of the present disclosure.

Referring to FIG. 1, the BIM device includes a controller 100, a memory 110, and a user interface 130. The controller 100 performs an operation for BIM according to an embodiment of the present disclosure which will be described below, and the memory 110 stores various information required for the operation of the BIM device and input information.

Specifically, the memory 110 may include a BIM database (DB) 120, and the BIM DB 120 may include building function information and building specification information as BIM information. The building function information includes type information of a building, and the building specification information includes building configuration information for each type of building. The building configuration information may include, for example, information on the number of floors of a corresponding building, direction information, device information (heating, ventilation, and air conditioning (HVAC)), lighting information, elevator information, and occupancy information.

The user interface 130 corresponds to a configuration unit for providing information to a user or receiving information from the user. For example, the user interface 130 may receive BIM information on a corresponding building from the user when BIM information of a building, which the user wants, does not exist in the BIM DB 120.

Hereinafter, a BIM process performed by the BIM device configured as described above will be discussed.

Figure 2:
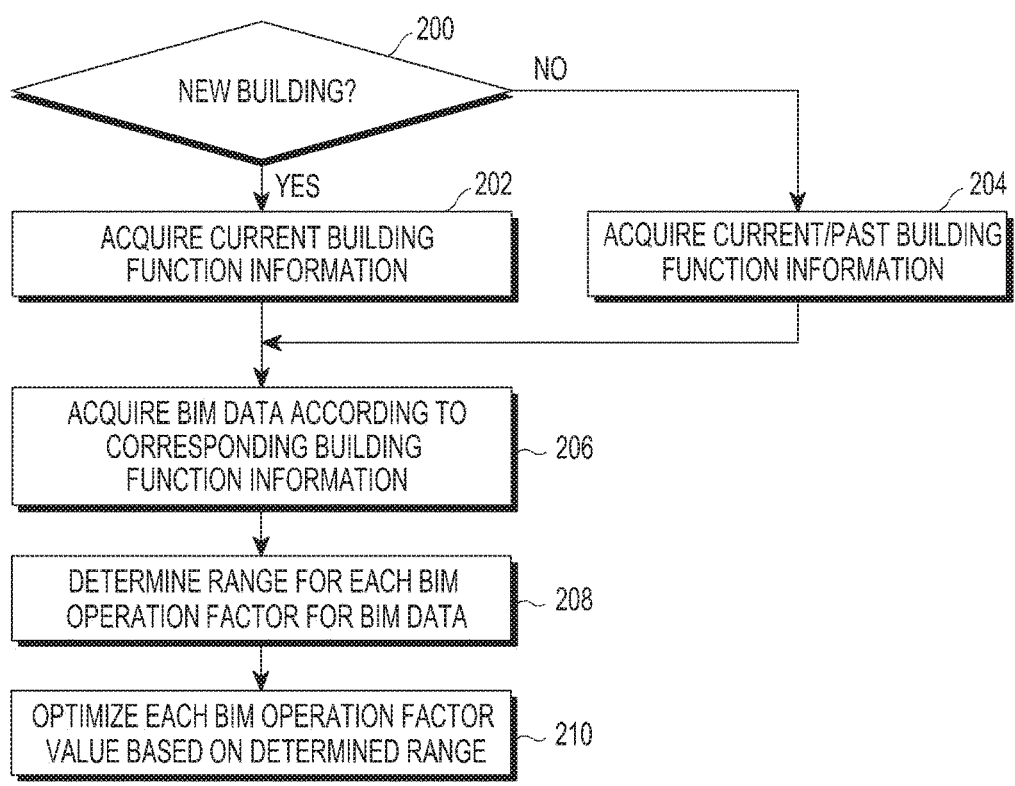
FIG. 2 is a flow chart illustrating a BIM process of a BIM device according to an embodiment of the present disclosure.

FIG. 2 is a flow chart illustrating a BIM process of a BIM device according to an embodiment of the present disclosure.

Referring to FIG. 2, a BIM process according to an embodiment of the present disclosure may largely include a pre-processing process as shown in steps 200 to 208 and an optimization process as shown in step 210.

In the pre-processing process, the BIM device firstly divides a corresponding building into a new building or an existing building. This is because of the different modeling methods when the corresponding building is a new building or an existing building. When the corresponding building is a new building in step 200, the BIM device acquires building function information for the new building in step 202. Since the new building does not have a past history, the BIM device acquires building function information of a current time point. The building function information may be acquired from the BIM DB 120 or may be received and acquired from a user.

When the corresponding building is not a new building, i.e., is an existing building, the BIM device acquires current and past building function information of the existing building in step 204. For example, when the existing building used to be a hospital but has currently been changed to a hotel, the BIM device acquires information on the hospital as the past building function information, and acquires information on the hotel as the current building function information.

The BIM device acquires building configuration information (hereinafter, referred to as "BIM data") according to the acquired building function information in step 206. The BIM data may include, for example, information on the number of floors, direction information, device information, lighting information, elevator information, and occupancy information of the building. Meanwhile, when the corresponding building is an existing building, past climate information may also be used as the past BIM data. Further, the BIM data such as device information, materials information, and occupancy information may include BIM operation factors (or BIM elements) such as scheduling and a size of each zone.

The BIM device determines a range (domain) for each BIM operation factor in step 208. The range may include an average and a standard deviation. Additionally, ranges of BIM parameters according to a construction time may be changed even in the case of the same building, and these era-specific matters may also be reflected in the pre-processing process.

When the pre-processing is terminated, the BIM device performs a BIM operation factor optimization process (BIM operation factor (parameter) calibration process) in step 210. Herein, the optimization process indicates a process of determining a value of each BIM operation factor through optimization. In the optimization processor, the BIM device extracts predetermined value one by one in a range of each BIM operation factor and then generates predetermined number of a BIM operation factor sets. Next, the BIM device calculates power consumption through simulation for each BIM operation factor set. Further, the BIM device compares power consumption, which is obtained when past history information of a corresponding building is collected, with the calculated power consumption to calculate an error.

The BIM device generates the predetermined number of BIM operation factor sets, and then repeats a process of determining two sets as an upper layer where an error is low to terminate optimization when the error is less than or equal to a predetermined value. The BIM operation factor set where the error is minimized relates to a modeling input factor for the building and may predict energy consumption based on a future climate or may be used for another application. In an algorithm development step, an algorithm selection or an operation factor value selection may be performed through a process of identifying whether an energy consumption prediction error, which is obtained through modeling, corresponds to a satisfied error range.

Hereinafter, the pre-processing process and optimization process as described above will be specifically discussed.

(1) Pre-Processing Process: Method of Acquiring Building Function Information

In a step, which is the first step of the pre-processing process, of acquiring building function information, building function information of a corresponding building may be acquired based on information for predetermined building groups.

Figure 3:
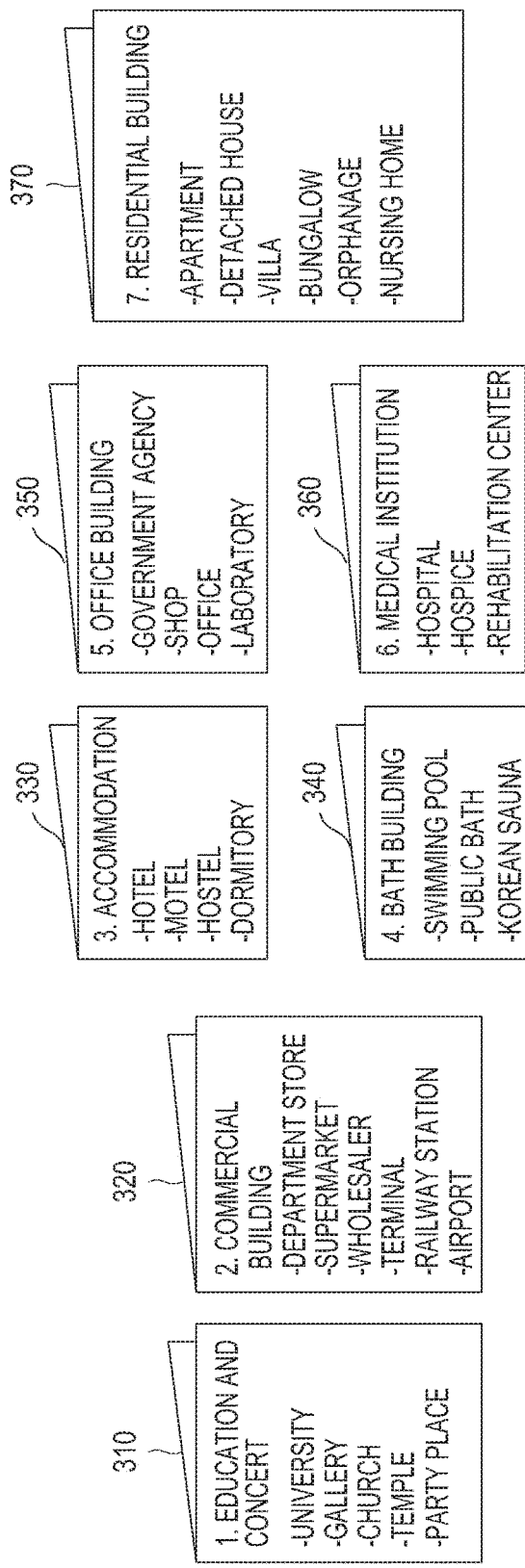
FIG. 3 illustrates an example of building groups according to an embodiment of the present disclosure.

FIG. 3 illustrates an example of building groups according to an embodiment of the present disclosure.

For example, FIG. 3 illustrates seven building groups such as an education and concert building 310, a commercial building 320, an accommodation building 330, a bath building 340, an office building, a healthcare building 360, and a residential building 370. The BIM device may determine which type of building a corresponding building corresponds to based on the seven building groups. Meanwhile, while only a current building function has been reflected conventionally when BIM data for a new building is calculated, both the current building function and a past building function are reflected in the embodiment of the present disclosure. Therefore, it is possible to perform a practical BIM.

(2) Pre-Processing Process: Method of Acquiring BIM Data According to Building Function Information When the BIM device acquires the building function information, the BIM device may acquire BIM data which is building configuration information according to the acquired building function information. The BIM data is shown as an example in FIG. 4A.

Figure 4A:
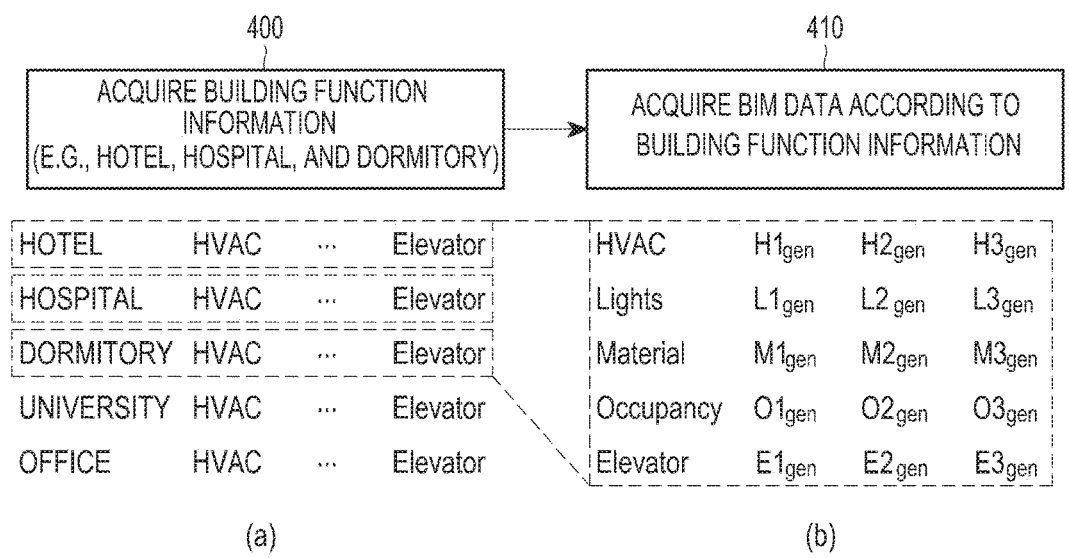
FIG. 4A illustrates an example of BIM data acquired according to building function information according to an embodiment of the present disclosure.

FIG. 4A illustrates an example of BIM data acquired according to building function information according to an embodiment of the present disclosure.

Referring to FIG. 4A, when building function information has been acquired in step 400, the BIM device acquires BIM data according to the acquired building function information in step 410. (a) of FIG. 4A illustrates an example of BIM data when current building function information (hotel) and past building function information (hospital and dormitory) are acquired as a corresponding building is an existing building.

Specifically, in (a) of FIG. 4A, BIM data for each piece of building function information may include device information (HVAC), light information, material information, occupancy information, and elevator information. Meanwhile, as shown in (b) of FIG. 4A, each BIM data may include a plurality of BIM operation factors. For example, the HVAC may include $H1_{gen}$, $H2_{gen}$, and $H3_{gen}$ indicating a BIM operation factor such as heating information, ventilation information, and air-conditioning information.

(3) Pre-Processing Process: Method of Determining Range for Each BIM Operation Factor for BIM Data When all BIM data for each piece of building function information has been acquired, the BIM device selects BIM data to be used and configures a suitable range for a BIM operation factor related to the selected BIM data. In the prior art, a predetermined range for a BIM operation factor value of a specific building is configured based on reference information described in a standard (e.g., ASHRAE). However, in the embodiment of the present disclosure, a range is configured based on a history and a rate of the building, so as to reduce the uncertainty and thus improve the accuracy.

Figure 4B:
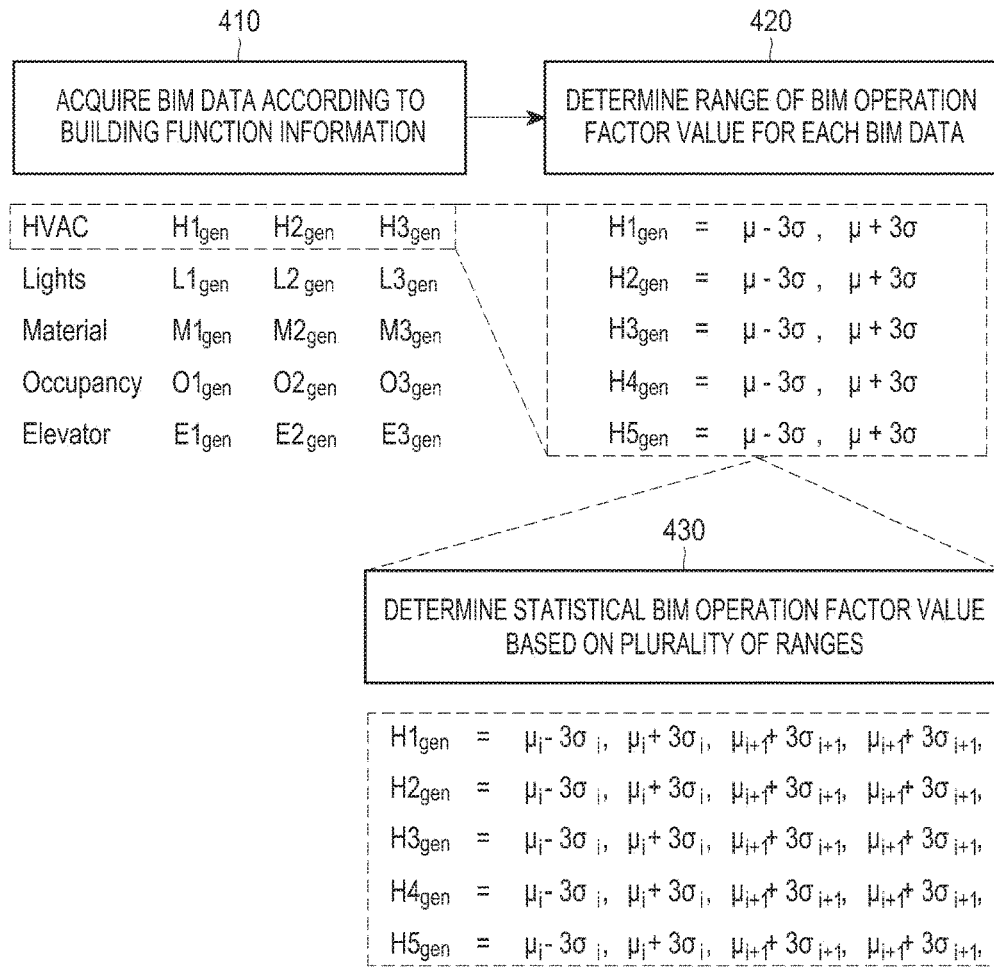
FIG. 4B illustrates a process of configuring multiple ranges (domains) for a BIM parameter according to an embodiment of the present disclosure.

FIG. 4B illustrates a process of configuring multiple ranges (domains) for a BIM parameter according to an embodiment of the present disclosure.

Referring to FIG. 4B, when BIM data according to building function information has been acquired in step 410, the BIM device determines a range of the BIM operation factor value for each BIM data in step 420. Herein, the BIM device determines a range of the BIM operation factor value for each piece of BIM data according to past building function information when a corresponding building is an existing building.

When the past building function information of the corresponding building indicates a hospital and a store, and current building function information indicates a hotel, the BIM device may determine a range of the BIM operation factor for each piece of BIM data related to the hospital, the store, and the hotel, thereby generating a plurality of ranges. In this event, the BIM device determines a statistical BIM operation factor value based on the plurality of ranges in step 430.

For example, when five BIM operation factors of HVAC, which are $H1_{gen}$, $H2_{gen}$, $H3_{gen}$, $H4_{gen}$, and $H5_{gen}$, exist, a plurality of ranges may be configured using an average value and a variance value for each operation factor.

Figure 5A:
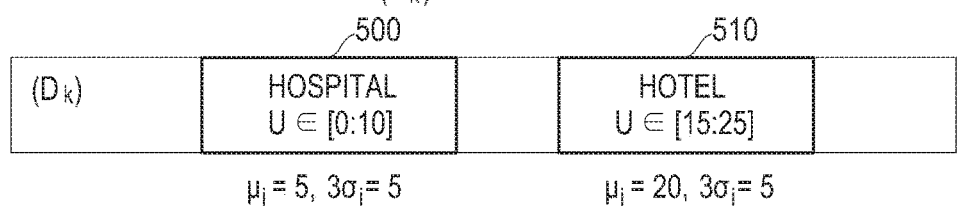
FIG. 5 illustrates a BIM parameter range having two characteristics according to an embodiment of the present disclosure.
Figure 5B:
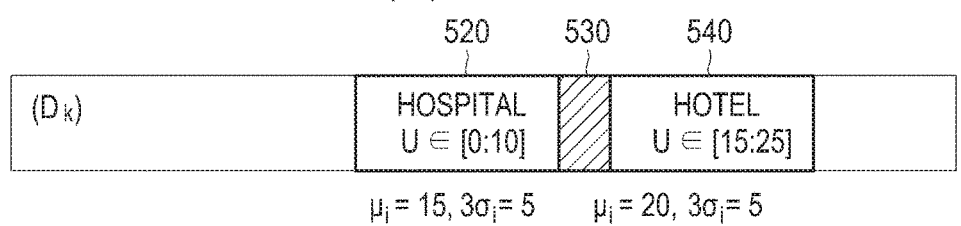

In the embodiment of the present disclosure, a range is configured based on the history and rate of the building and the configured range is shown as an example in FIG. 5.

FIG. 5 illustrates a BIM parameter range having two characteristics according to an embodiment of the present disclosure.

In the embodiment of the present disclosure, a range of a BIM operation factor may largely have a discontinuity characteristic as shown in (a) of FIG. 5 and an intersection characteristic as shown in (b) of FIG. 5.

Referring to (a) of FIG. 5, when a building used to be a hospital in the past and is a hotel now, ranges of BIM operation factors for BIM data of the hotel and the hospital may be configured respectively. A range ($U \in [15:25]$)(average $\mu_i=20$, variance $3\sigma_i=5$) 510 of the BIM operation factor for the hotel is not overlapped with a range ($U \in [0:10]$) (average $\mu_i=5$, variance $3\sigma_i=5$) 500 of the BIM operation factor for the hospital. In the embodiment of the present disclosure, since all ranges ($D_k \in [0:10], [15:25]$) of the BIM operation factors for the current history and the past history, i.e., the hotel and the hospital have been reflected, a substantially optimal BIM operation factor value may be more accurately determined in comparison with an existing method which does not reflect the past history (i.e., conventionally, only the range ($D_k \in [15:25]$) of the BIM operation factor for the hotel is reflected).

Meanwhile, the range of the BIM operation factor for the BIM data of the hotel and hospital may be overlapped as shown in (b) of FIG. 5. In this event, the range is to be widened (i.e., $D_k \in [10:25]$) in comparison with a case in which only the range ($D_k \in [15:25]$) of the BIM operation factor for the hotel is reflected. When the range is to be widened, a derivable range of the optimal BIM operation factor value is widened, and an unmodified BIM operation factor value of an actual existing building may be more accurately detected through optimization.

Additionally, although the building history has not been changed according to the construction time of the building, a range of a main BIM operation factor may be different. In the embodiment of the present disclosure, a range of the BIM operation factor may be extended or changed by reflecting an operation factor reflecting era-specific matters.

Accuracy for a general range configuration scheme and a range configuration scheme according to the embodiment of the present disclosure will be described below in reference to FIGS. 6 and 7.

Figure 6A:
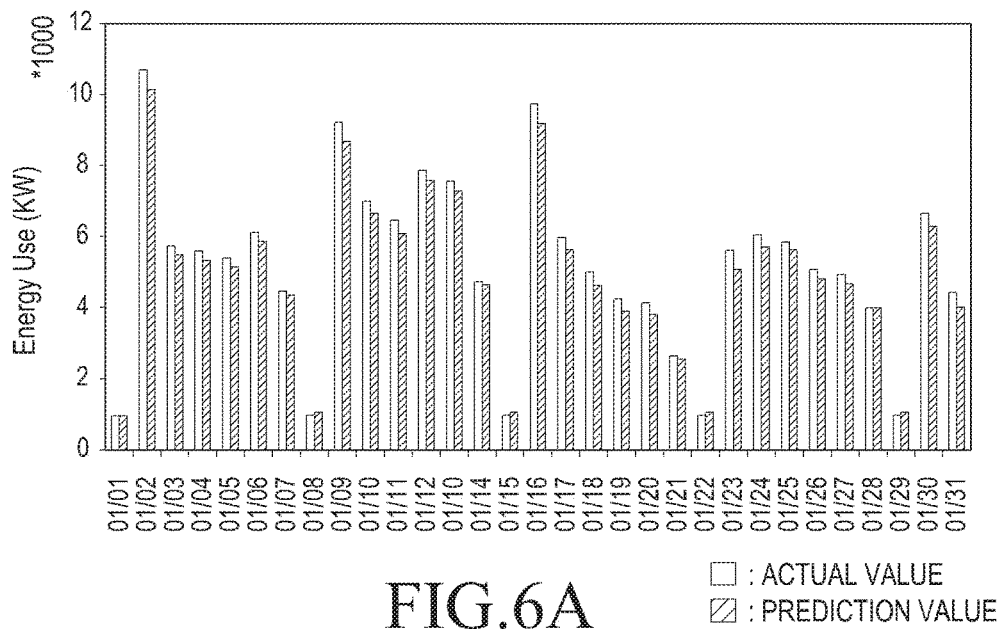
FIG. 6 is a graph obtained by comparing an actual value and a predictive value of power consumption when using a general BIM parameter range configuration scheme.
Figure 6B:
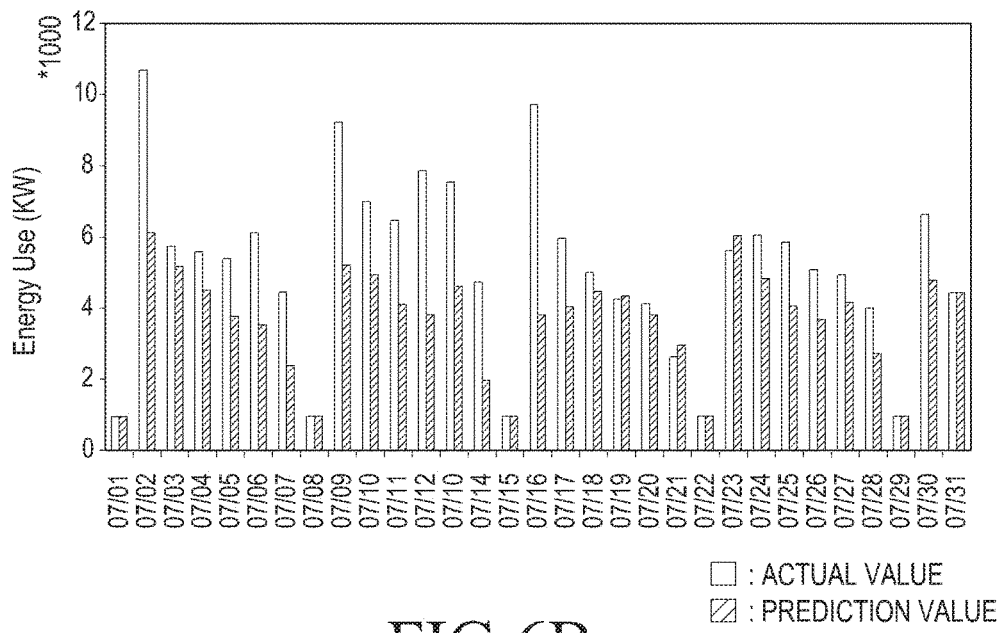

FIG. 6 is a graph obtained by comparing an actual value and a predictive value of power consumption when using a general BIM operation factor range configuration scheme.

FIG. 6 illustrates a simulation result of a case in which a general BIM operation factor range configuration scheme is used. (a) of FIG. 6 illustrates an actual value and a predictive value of power consumption for the month of January, and it seems that an error between the actual value and the predictive value is low so that optimization is performed well. However, if discussing an actual value and a predictive value of power consumption for the month of July shown in (b) of FIG. 6, it is known that an error between the actual value and the predictive value is large so that accuracy significantly falls. This may be considered as a problem which is generated because the range of the BIM operation factor is not properly applied so that the optimized BIM is not performed.

Figure 7A:
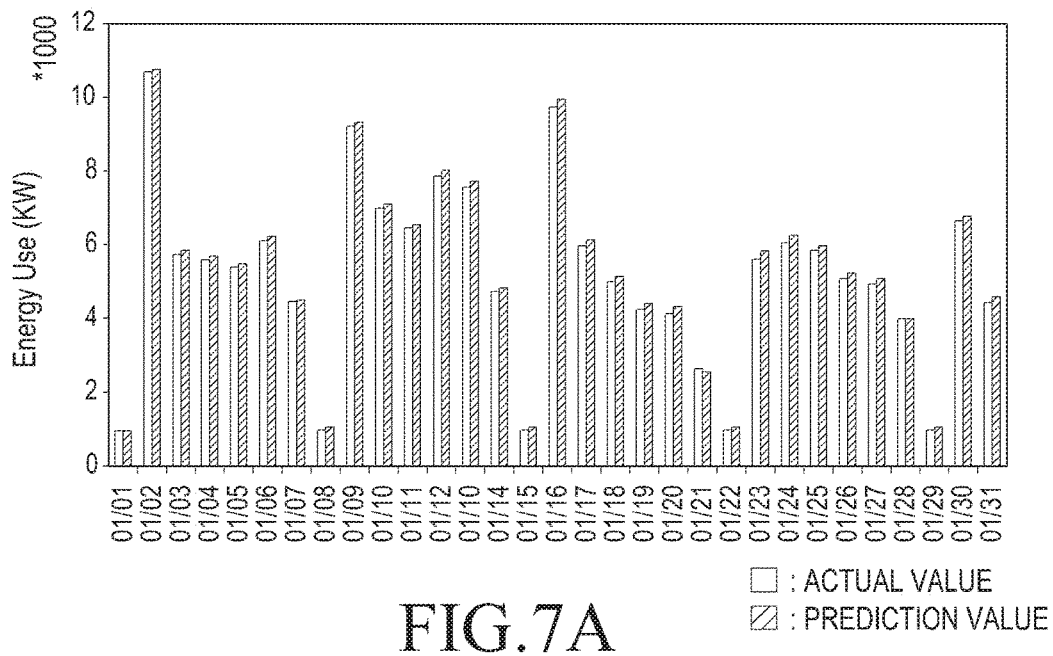
FIG. 7 is a graph obtained by comparing an actual value and a predictive value of power consumption when using a general BIM parameter range configuration scheme according to an embodiment of the present disclosure.
Figure 7B:
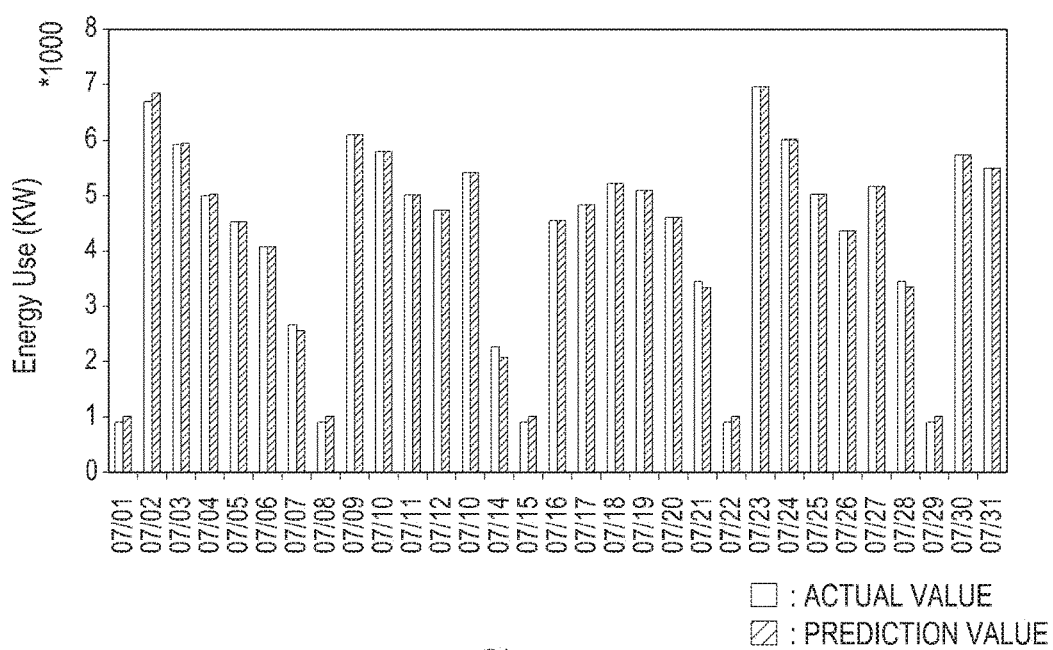

FIG. 7 is a graph obtained by comparing an actual value and a predictive value of power consumption when using a BIM operation factor range configuration scheme according to an embodiment of the present disclosure.

FIG. 7 illustrates a simulation result reflecting a BIM operation factor range having intersecting characteristics as shown in (b) of FIG. 5. (a) and (b) of FIG. 7 illustrate actual values and predictive values of power consumption for each month, i.e., January and July and it may be known that accuracy for both January and July are high and there is almost no change in comparison with (a) and (b) of FIG. 6. This may be a result in which a BIM for a specific building is properly performed by extending the range of the BIM operation factor. When an adaptive BIM operation factor range according to the embodiment of the present disclosure is reflected, accuracy of building modeling may increase.

(4) Optimization Process

An optimization process according to the embodiment of the present disclosure relates to a method for overcoming limitations of a general optimization method, and corresponds to a method which can be applied when a solution satisfying several optimization problems having an identical design domain is desired to be found.

In the embodiment of the present disclosure, for example, three optimization problems are proposed. First, there is device information error minimization problem related to a performance of a device itself. HVAC(t), Lighting(t), and Appliance(t) may be mainly included. Second, there is an optimization problem of occupancy information which can belong to each zone of a building. Occupancy scheduling can be modeled based on a past pattern or through information of meeting room reservation information in a case of an office. Third, there is an environment information optimization problem for each zone, and scheduling information such as a configuration temperature (setpoint) for each zone and information in a case of a holiday may be mainly considered.

When solving the three problems, all operation factors such as HVAC(t), Lighting(t), Appliance(t), Occupancy(t), ZoneSetpoint(t), and Holiday(t) actually described above as examples may be individually used. In other words, when the three problems are optimized, the operation factors have an identical range. In this event, a general individual optimization method is described below.

Figure 8A:
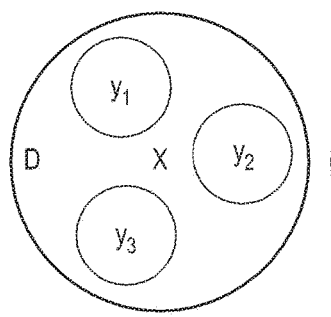
FIG. 8 illustrates a general optimizing method.
Figure 8B:
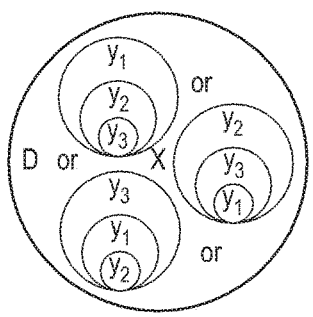
Figure 8C:
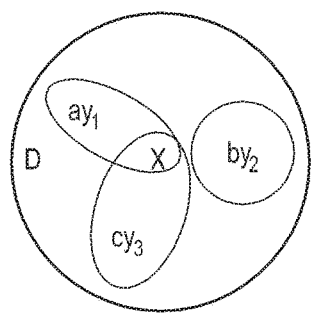

FIG. 8 illustrates a general optimization method.

A general optimization method includes an individual optimization method, a sequential optimization method, and a single objective method. Further, in FIG. 8, $y_1$ indicates a device information optimization value, $y_2$ indicates an occupancy information optimization value, and $y_3$ indicates an environment information optimization value. In addition, in FIG. 8, x indicates global solution Y(x) as a solution satisfying three optimization problems, and D indicates a range of an optimized operation factor value (e.g., D={x1, x2, x3, x4, x5, x6, x7, x8, x9}).

As shown in (a) of FIG. 8, when individual optimization is performed as values (D) of $y_1$, $y_2$, and $y_3$ optimization parameters are different, the global solution Y(x) reflecting all $y_1$, $y_2$, and $y_3$ cannot be derived.

Further, as shown in (b) of FIG. 8, when sequential optimization is to be performed in a state in which an identical operation factor value (D) for $y_1$, $y_2$, and $y_3$ can be derived, it is difficult to derive the global solution Y(x) by the occurrence of range limitations.

Further, as shown in (c) of FIG. 8, when a method of assigning a weighted value to $y_1$, $y_2$, and $y_3$ is used, at least two of $y_1$, $y_2$, and $y_3$ may derive the identical optimization operation factor value (D), but a case in which it is difficult to derive the global solution Y(x) occurs due to the influence of the weighted value.

Therefore, in the embodiment of the present disclosure, a distributed range optimization method is proposed instead of using the methods described above. The distributed range optimization method corresponds to a method of simultaneously calculating and progressing three optimization problems. Herein, it is noted that an optimized operation factor value according to the combination of an operation factor, which has large influence, among the operation factors and a dominant factor may be calculated. Therefore, a calculation time for optimization may be shortened.

For example, a method of optimizing three values $y_1$, $y_2$ and $y_3$ will be described. The method includes a method of combining an operation factor, which has a large influence on $y_1$, $y_2$, and $y_3$, among operation factors in an identical range and a dominant factor $y^*_1$, $y^*_2$, and $y^*_3$ of $y_1$, $y_2$, and $y_3$.

$$Y = f\begin{pmatrix} \text{device information, occupancy information,} \\ \text{environment information for each zone} \end{pmatrix}$$ [Equation 1]

$$= f\begin{pmatrix} HVAC(t), Lighting(t), Applicance(t), \\ Occupancy(t), ZoneSetPoint(t), Holiday(t) \end{pmatrix}$$

In equation 1, Y indicates an optimization value for each of device information, occupancy information, and environment information for each zone. Herein, parameters related to the device information may be exemplified as [HVAC(t), Lighting(t), Appliance(t)], and a parameter related to the occupancy information may be exemplified as [Occupancy (t)]. Further, parameters related to the environment information for each zone may be exemplified as [Zone Setpoint (t), Holiday(t)] for an HVAC configuration temperature applied to each space and a setting value which is different from weekdays in the case of a holiday. Herein, t corresponds to, for example, t∈[1:24].

A calculating formula of $y_1$, $y_2$ and $y_3$ according to equation 1 is identical to equation 2 below.

$$y_{1,t}=f(x_{1,t},x_{2,t},x_{3,t},x^*_{4,t},x^*_{5,t},x^*_{6,t})$$

$$y_{2,t}=f(x^*_{1,t-1},x^*_{2,t-1},x^*_{3,t-1},x_{4,t},x^*_{5,t-1},x^*_{6,6-1})$$

$$y_{3,t}=f(x^*_{1,t-1},x^*_{2,t-1},x^*_{3,t-1},x^*_{4,t-1},x_{5,t},x_{6,t})$$ [Equation 2]

In equation 2, $y_{1,t}$ indicates a device information optimization value in a t time, $x_{1,t}$, $x_{2,t}$, and $x_{3,t}$ indicate device information parameters in a t time, $x^*_{4,t-1}$ indicates a constant value corresponding to an occupancy information optimization value in a t−1 time, and $x^*_{5,t-1}$, and $x^*_{6,t-1}$ indicate a constant value corresponding to an environment information optimization value for each zone in the t−1 time.

Further, $y_{2,t}$ indicates the occupancy information optimization value in the t time, $x_{4,t}$ indicates the occupancy information parameter in the t time, $x^*_{1,t-1}$, $x^*_{2,t-1}$, $x^*_{3,t-1}$ indicate constant values corresponding to the device information optimization values in the t−1 time, and $x^*_{5,t-1}$, and $x^*_{6,t-1}$ indicate constant values corresponding to the environment information optimization values for each zone in the t−1 time.

Further, $y_{3,t}$ indicates the environment information optimization value for each zone in the t time, $x_{5,t}$ and $x_{6,t}$ indicate the environment information parameter for each zone in the t time, $x^*_{1,t-1}$, $x^*_{2,t-1}$, and $x^*_{3,t-1}$ indicate constant values corresponding to the device information optimization values in the t−1 time, and $x^*_{4,t-1}$ indicates a constant value corresponding to the occupancy information optimization value in the t−1 time. Herein, t and t−1 refer to each step in which an optimization algorithm is operated.

In the embodiment of the present disclosure, an optimization value for the corresponding information in a next time may be calculated using the optimization value of other information determined in the previous time, such that a plurality of optimization problems may be effectively solved.

Figure 9:
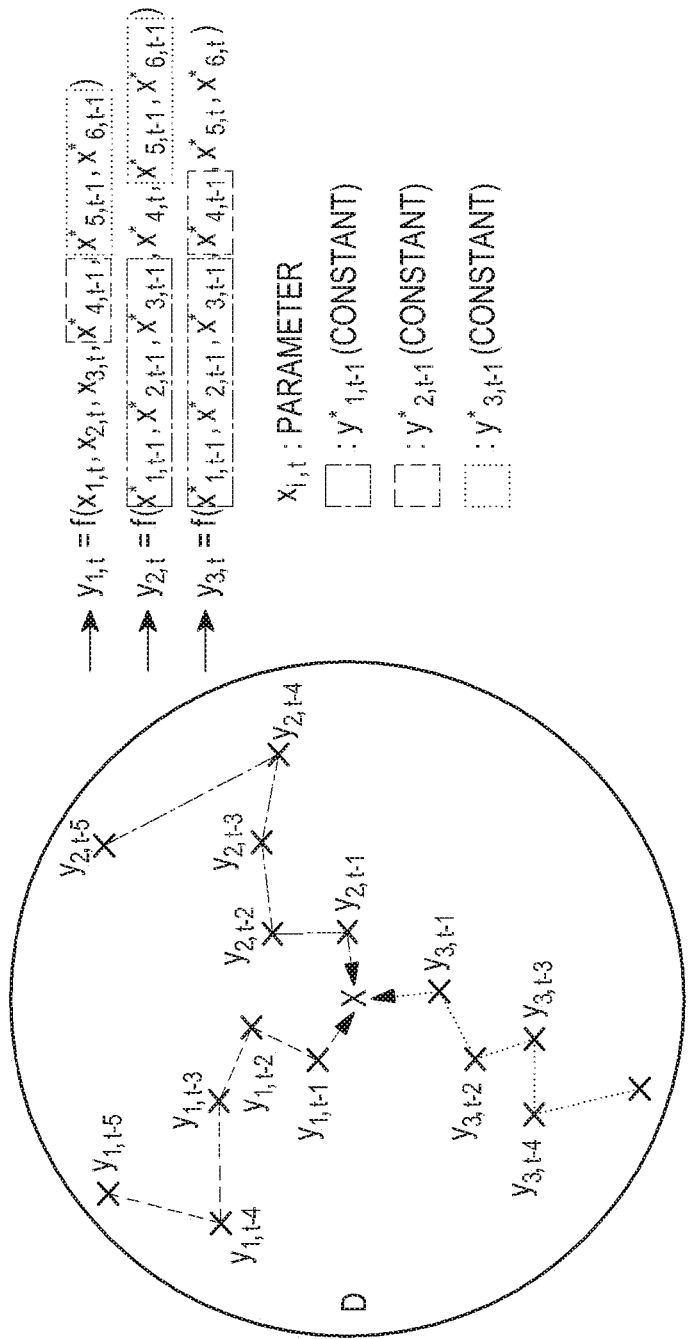
FIG. 9 illustrates a distribution range optimizing method according to an embodiment of the present disclosure.

FIG. 9 illustrates a distribution range optimizing method according to an embodiment of the present disclosure.

FIG. 9 illustrates an example of describing an optimized model according to equation 2. Referring to FIG. 9, it is identified that a device information optimization value, an occupancy information optimization value, and an environment information optimization value for each zone, which are calculated in each time, are collected as values which satisfy $y_{1,t}$, $y_{2,t}$, and $y_{3,t}$. That is, device information error minimization, $y_1$=min(device information)=min(HVAC(t), Light(t), App.(t)), occupancy information error minimization, $y_2$=min(occupancy)=min(Occupancy(t)), environment information error minimization for each zone $y_3$=min(environment information)=min(ZoneS.P(t),Holiday(t)) are repeatedly calculated, and the device information optimization value, the occupancy information optimization value, and the environment information optimization value for each zone are collected as values which satisfy each of them.

As described above, in the embodiment of the present disclosure, an input value (i.e., operation factor required to be accurately modelled when a BEMS for effective energy use is applied) which is used when a building energy simulation is used may be derived. Further, in the embodiment of the present disclosure, climate based energy consumption prediction, abnormal state monitoring, and building modeling which can effectively manage building energy are possible, these reflect a new/existing building characteristic, a periodic characteristic, and a history of a past building, and an optimized solution is detected based on the distribution range optimization scheme so that a more realistic and highly accurate modeling may be performed. Therefore, according to the embodiment of the present disclosure, energy simulation modeling through measurement may be simple, and modeling having high accuracy when using reference information defined in the standard may be performed.

The present disclosure may classify buildings according to functions and utilize database including history information, periodic information, and construction materials information of a building so as to practically extract information according to a type of an existing building, unlike existing measurement information utilization, standard (e.g., ASHRAE 90.1) apply, or a Bayesian BIM scheme. Further, the present disclosure may minimize an error using the extracted information in a range (domain) of each input factor.

Further, when an optimization method proposed in the present disclosure is used, a global solution calculation simultaneously reflecting device information, occupancy information, and environment information for each zone is possible, and a calculation time may be shortened. When this optimization method is applied to a new building, before applying a system such as a BEMS through energy simulation, an effect of the system may be verified in advance and it may be helpful in selecting a system. Further, when effective energy through this is used, an energy saving effect in comparison with existing system may be easily derived with high accuracy.

Although the embodiment has been described in the detailed description of the present disclosure, the present disclosure may be modified in various forms without departing from the scope of the present disclosure. Therefore, the scope of the present disclosure should not be defined as being limited to the embodiments, but should be defined by the appended claims and equivalents thereof.

The invention claimed is:

1. A method of determining information for building information modeling (BIM) by a BIM device in a building energy management system, the method comprising:
   acquiring BIM data corresponding to first type information at a first time point and second type information at a second time point related to a use characteristic of a physical building among previously stored BIM data, wherein the first time point precedes the second time point, and the first type information at the first time point is different from the second type information at the second time point;
   determining a plurality of ranges for each of a plurality of parameters in the BIM data by using values of each of the plurality of parameters corresponding to the first type information and the second type information related to the use characteristic of the physical building;
   generating multiple parameter sets based on the plurality of ranges for each of the plurality of parameters;
   calculating a power consumption for each of the multiple parameter sets;
   determining at least one of the multiple parameter sets as at least one parameter set to be used for the BIM at the second time point, based on the power consumption calculated for each of the multiple parameter sets; and
   managing the power of the physical building based on the at least one parameter set used for the BIM at the second time point.

2. The method of claim 1, wherein the determining of the plurality of ranges comprises determining the plurality of ranges for each of the plurality of parameters by using an average value and a variance value of the values for each of the plurality of parameters.

3. The method of claim 1, wherein the generating of the multiple parameter sets comprises generating a predetermined number of multiple parameter sets based on the plurality of ranges for each of the plurality of parameters.

4. The method of claim 1, wherein the determining of at least one of the multiple parameter sets comprises:
   comparing the power consumption calculated for each of the multiple parameter sets with a predetermined power consumption; and
   determining the at least one of the multiple parameter sets as the at least one parameter set to be used for the BIM at the second time point based on a result of the comparing.

5. The method of claim 4, wherein the comparing of power consumption comprises calculating an error value between the power consumption calculated for each of the multiple parameter sets and the predetermined power consumption.

6. The method of claim 5, wherein the at least one of the multiple parameter sets comprises at least one parameter set where the error value is less than or equal to a predetermined value among the multiple parameter sets.

7. The method of claim 4, wherein the predetermined power consumption comprises a power consumption calculated based on BIM data related to past type information of the physical building.

8. The method of claim 1, wherein the plurality of parameters comprises at least two of heating, ventilation, air conditioning (HVAC) information, light information, material information, occupancy information, or elevator information.

9. The method of claim 1, wherein the first type information and the second type information are identified from previously stored building type information based on the use characteristic of the physical building.

10. A building information modeling (BIM) device in a building energy management system, the device comprising:
    at least one processor configured to:
       acquire BIM data corresponding to first type information at a first time point and second type information at a second time point related to a use characteristic of a physical building among previously stored BIM data, wherein the first time point precedes the second time point, and the first type information at the first time point is different from the second type information at the second time point,
       determine a plurality of ranges for each of a plurality of parameters in the BIM data by using values of each of the plurality of parameters corresponding to the first type information and the second type information related to the use characteristic of the physical building, generate multiple parameter sets based on the plurality of ranges for each of the plurality of parameters, calculate a power consumption for each of the multiple parameter sets, determine at least one of the multiple parameter sets as at least one parameter set to be used for the BIM at the second time point, based on the power consumption calculated for each of the multiple parameter sets, and manage the power of the physical building based on the at least one parameter set used for the BIM at the second time point.

11. The BIM device of claim 10, wherein the at least one processor is further configured to determine the plurality of ranges for each of the plurality of parameters by using an average value and a variance value of the values for each of the plurality of parameters.

12. The BIM device of claim 10, wherein the at least one processor is further configured to generate a predetermined number of multiple parameter sets based on the plurality of ranges for each of the plurality of parameters.

13. The BIM device of claim 10, wherein the at least one processor is further configured to:

compare the power consumption calculated for each of the multiple parameter sets with a predetermined power consumption, and determine the at least one of the multiple parameter sets as at least one parameter set to be used for the BIM at the second time point based on a result of the comparing.

14. The BIM device of claim 13, wherein the at least one processor is further configured to calculate an error value between the power consumption calculated for each of the multiple parameter sets and the predetermined power consumption.

15. The BIM device of claim 14, wherein the at least one of the multiple parameter sets comprises at least one parameter set where the error value is less than or equal to a predetermined value among the multiple parameter sets.

16. The BIM device of claim 13, wherein the predetermined power consumption comprises a power consumption calculated based on BIM data related to past type information of the physical building.

17. The BIM device of claim 10, wherein the plurality of parameters comprises at least two of heating, ventilation, air conditioning (HVAC) information, light information, material information, occupancy information, or elevator information.

18. The BIM device of claim 10, wherein the first type information and second type information are identified from previously stored building type information based on the use characteristic of the physical building.

* * * * *